United States Patent
Xie et al.

(10) Patent No.: US 10,741,969 B2
(45) Date of Patent: Aug. 11, 2020

(54) CARD EDGE CONNECTOR EQUIPPED WITH EJECTOR INTERACTING WITH NEIGHBORING CONTACTS

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Ce-En Xie, Kunshan (CN); Zhuang-Xing Li, Kunshan (CN); Wen-Jun Tang, Kunshan (CN); Xue-Wu Bu, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/418,976

(22) Filed: May 21, 2019

(65) Prior Publication Data

US 2019/0363488 A1 Nov. 28, 2019

(30) Foreign Application Priority Data

May 24, 2018 (CN) .......................... 2018 1 0504760

(51) Int. Cl.
*H01R 13/629* (2006.01)
*H01R 12/73* (2011.01)
*H01R 12/72* (2011.01)

(52) U.S. Cl.
CPC ..... *H01R 13/62988* (2013.01); *H01R 12/721* (2013.01); *H01R 12/737* (2013.01)

(58) Field of Classification Search
CPC ............ H01R 13/62988; H01R 12/721; H01R 12/737; H01R 12/72; H01R 13/26; H01R 24/60
USPC ........ 439/157, 188, 325, 630, 637, 160, 377
See application file for complete search history.

(56) References Cited

U.S. PATENT DOCUMENTS

| 9,876,314 B1 * | 1/2018 | Cai ...................... H01R 12/721 |
| 10,056,715 B2 * | 8/2018 | Cai .................. H01R 13/62938 |
| 2007/0123076 A1 * | 5/2007 | Sabo .................... H01R 13/504 |
| | | 439/157 |

FOREIGN PATENT DOCUMENTS

| CN | 102882030 B | 5/2015 |
| CN | 204361349 U | 5/2015 |

* cited by examiner

*Primary Examiner* — Travis S Chambers
(74) *Attorney, Agent, or Firm* — Wei Te Chung; Ming Chieh Chang (57) ABSTRACT

A card edge connector includes an insulative elongated housing defining an elongated slot extending along a longitudinal direction. Two rows of contacts are disposed in the housing so as to be paired in each cross-sectional plane in a transverse direction. A pair of towers are located at two opposite ends of the housing in the longitudinal direction. A pair of ejectors/lockers are disposed in the corresponding towers and rotational about a pivot extending along the transverse direction. Each ejector has a bottom kicker adapted to intimately confront a bottom edge of the memory module for ejecting the memory module out of the housing. The kicker slightly interferes with the contacting sections of the neighboring contacts when the ejector is located at an outer position so as to be retained in position with regard to the housing.

18 Claims, 9 Drawing Sheets

CARD EDGE CONNECTOR EQUIPPED WITH EJECTOR INTERACTING WITH NEIGHBORING CONTACTS

BACKGROUND OF THE INVENTION

1. Field of the Invention

The invention relates to a card edge connectors, and particularly to the card edge connector equipped with at least one rotatable ejector interacting with a pair of neighboring contacts.

2. Description of Related Art

China Patent No. CN1028822030B discloses a card edge connector having an insulative elongated housing forming an elongated slot along the longitudinal direction for receiving a memory module (card) therein. A pair of rotatable ejectors are located at two opposite ends of the housing in the longitudinal direction for locking/ejecting the memory module in/out of position. Two rows of contacts are located in the housing by two opposite sides of the housing so as to cooperate with each other to sandwich the memory module between in the transverse direction perpendicular to the longitudinal direction. Understandably, the gap formed between the contacting sections of the paired contacts in each transverse cross-section should be smaller than the thickness of the memory module to efficiently sandwich the memory module therebetween in the transverse direction. Anyhow, because the rotation path of the bottom kicker of the ejector may interfere with the outermost/neighboring contacts, in CN102882030B patent either the contacting sections/points of such outermost/neighboring contacts are lifted up for not interfering with the bottom kicker of the conventional ejector, or the bottom kicker of the ejector is thinned in the transverse direction for not interfering with the traditional contacting sections of the traditional outermost/neighboring contacts. The former may resulting somewhat different electrical performance due to different contacting point levels between the contacting sections of the outermost contacts and those of the remaining contacts; the latter may tend to have the thinned bottom kicker broken due to its relatively weak structure strength.

An improved plug connector is desired to avoid the shortcomings of the aforementioned two situations.

SUMMARY OF THE INVENTION

An object of the present invention is to provide a card edge connector equipped with the ejector properly interacting with the neighboring outermost contacts within the acceptable performance range both electrically and mechanically.

To achieve the above-mentioned object, a card edge connector includes an insulative elongated housing defining an elongated slot extending along a longitudinal direction and located between a pair of side walls of the housing in the transverse direction perpendicular to the longitudinal direction. Two rows of passageways are formed in the corresponding side walls, respectively. Two rows of contacts are disposed in the corresponding passageways, respectively, so as to be paired in each cross-sectional plane in the transverse direction. A pair of towers are located at two opposite ends of the housing in the longitudinal direction. A pair of ejectors/lockers are disposed in the corresponding towers and rotational about a pivot extending along the transverse direction. Each ejector has a top locker and a bottom kicker wherein the locker is adapted to be received within a corresponding notch formed in the side edge of the memory module, while the kicker is adapted to intimately confront a bottom edge of the memory module for ejecting the memory module out of the housing. The outermost contacts neighboring the ejectors may be same with or optimally slightly different from the remaining contacts while still maintaining the same level contacting points of the contacting sections. The kicker of the ejector are slightly thinned compared with the traditional one while still slightly interfering with the contacting sections of the neighboring outermost contacts when the ejector is rotatably moved to the outer position so as to have the kicker of the ejector keep the required thickness for its own strength consideration while not jeopardizing the contacting sections of the neighboring outermost contacts. The ejector may be held at the outer position by the contacting sections of the neighboring outermost contacts.

DETAILED DESCRIPTION OF THE PREFERRED EMBODIMENT

Figure 1:
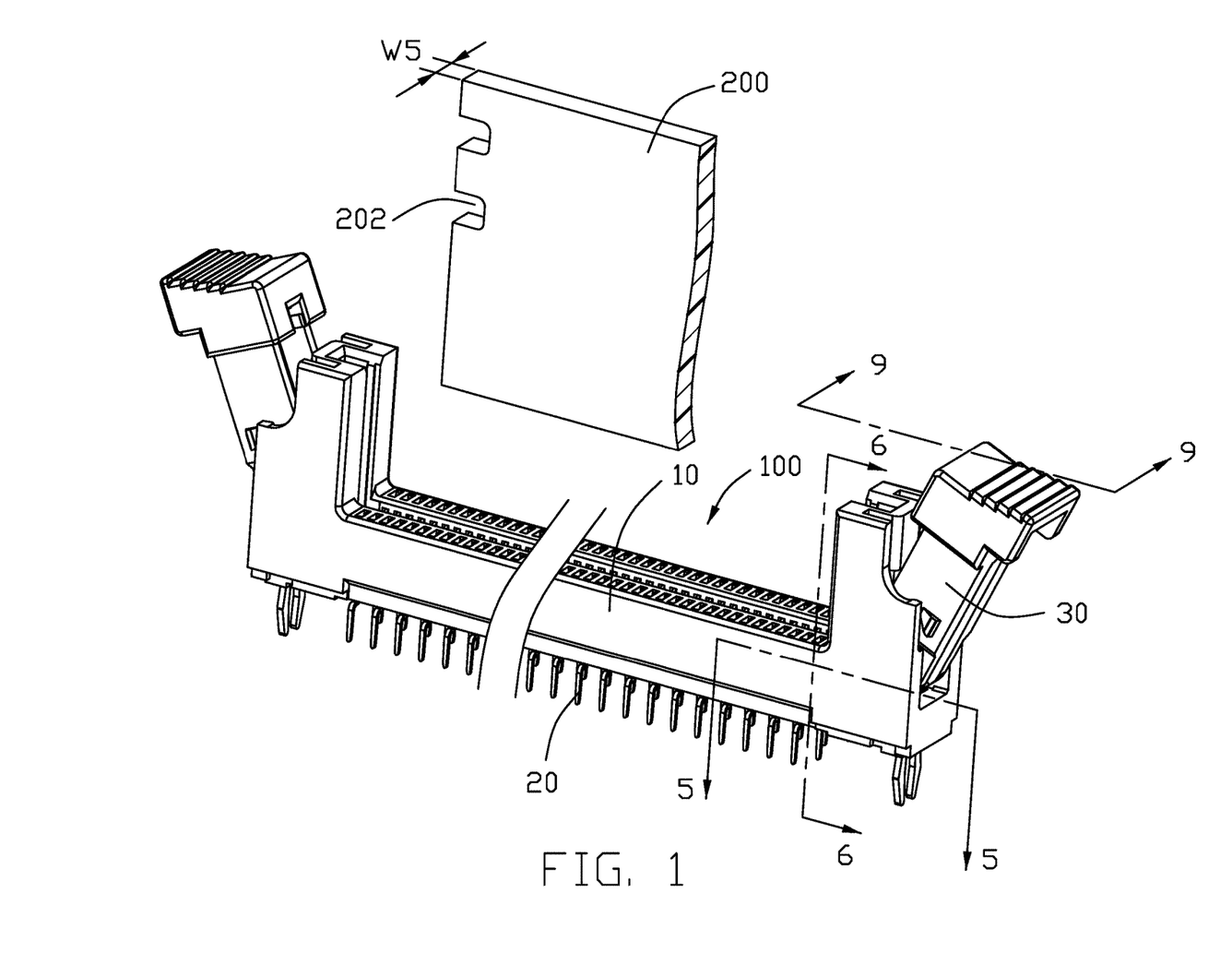
FIG. 1 is a perspective view of a card edge connector in accordance with present invention.
Figure 2:
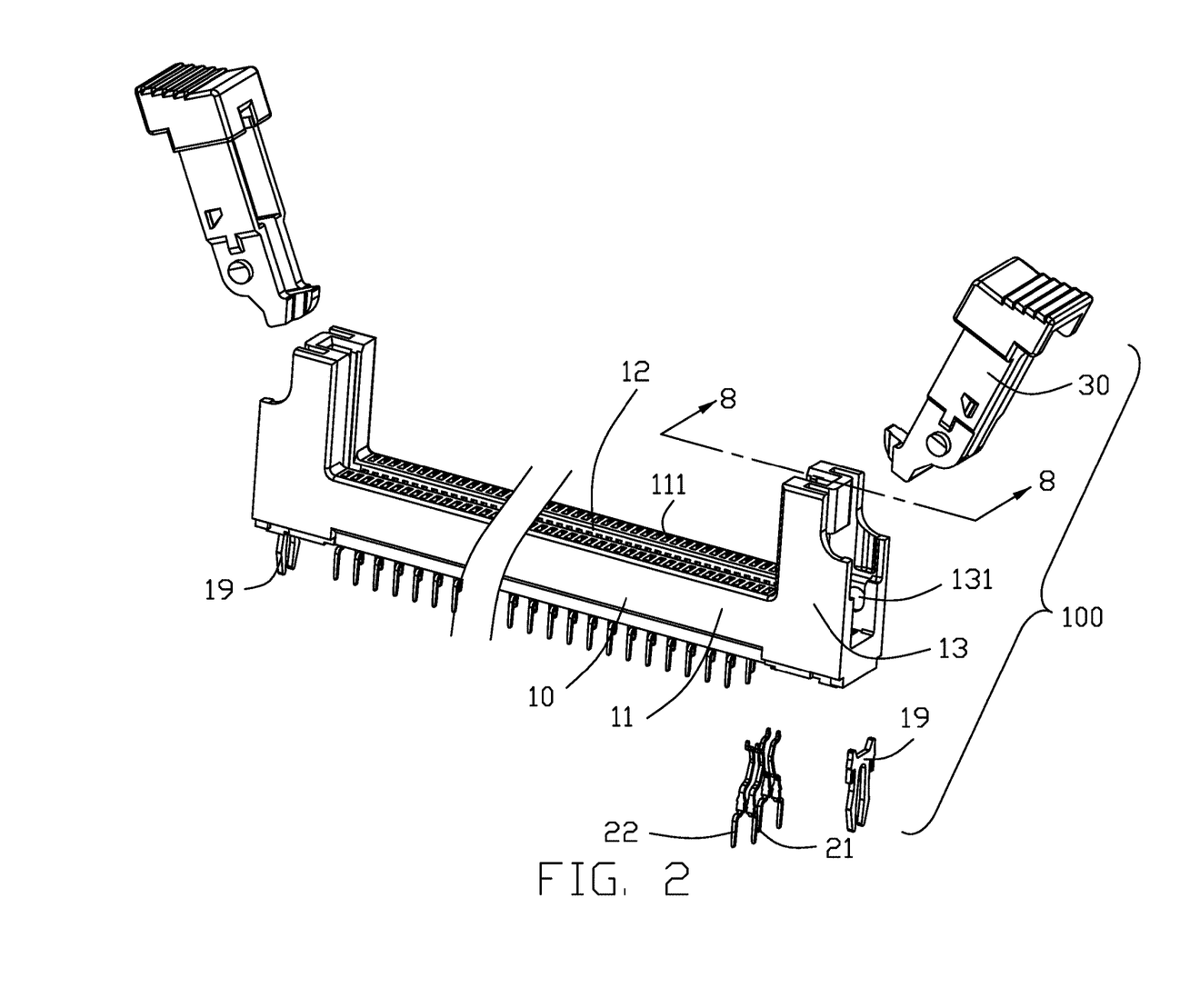
FIG. 2 is an exploded perspective view of the card edge connector of FIG. 1.
Figure 3:
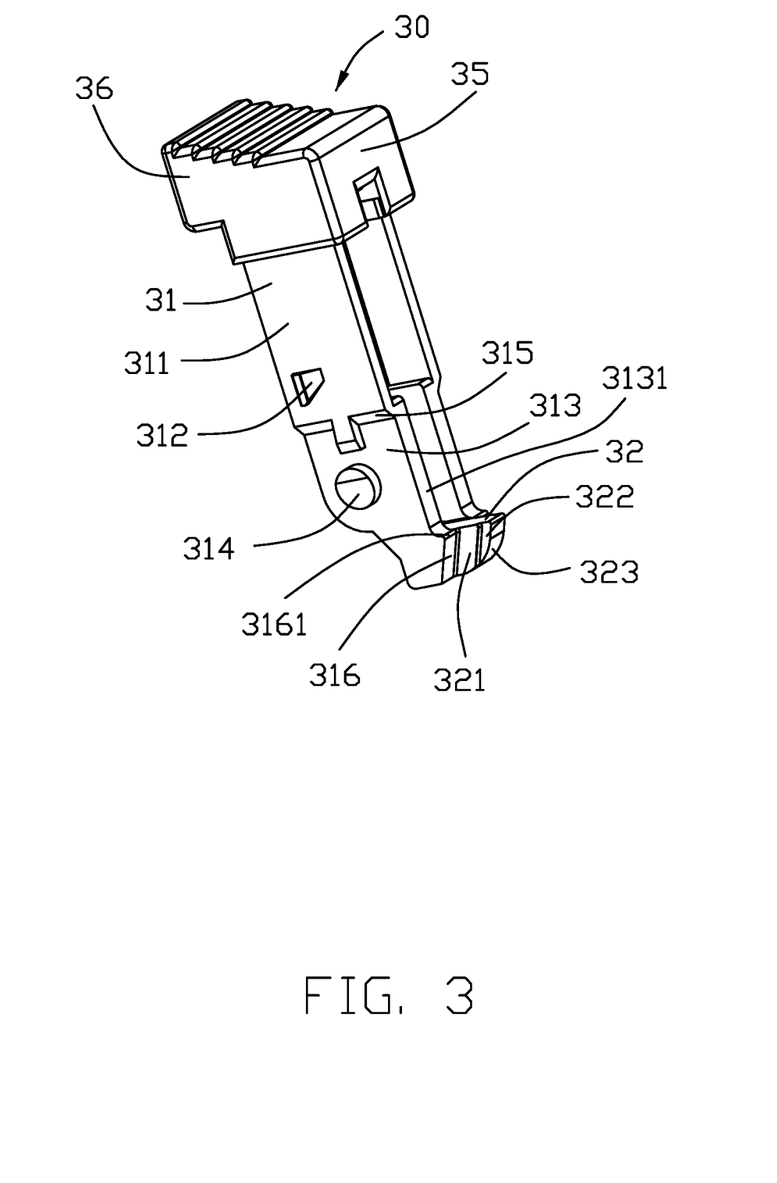
FIG. 3 is a perspective view of the ejector of the card edge connector of FIG. 1.
Figure 4:
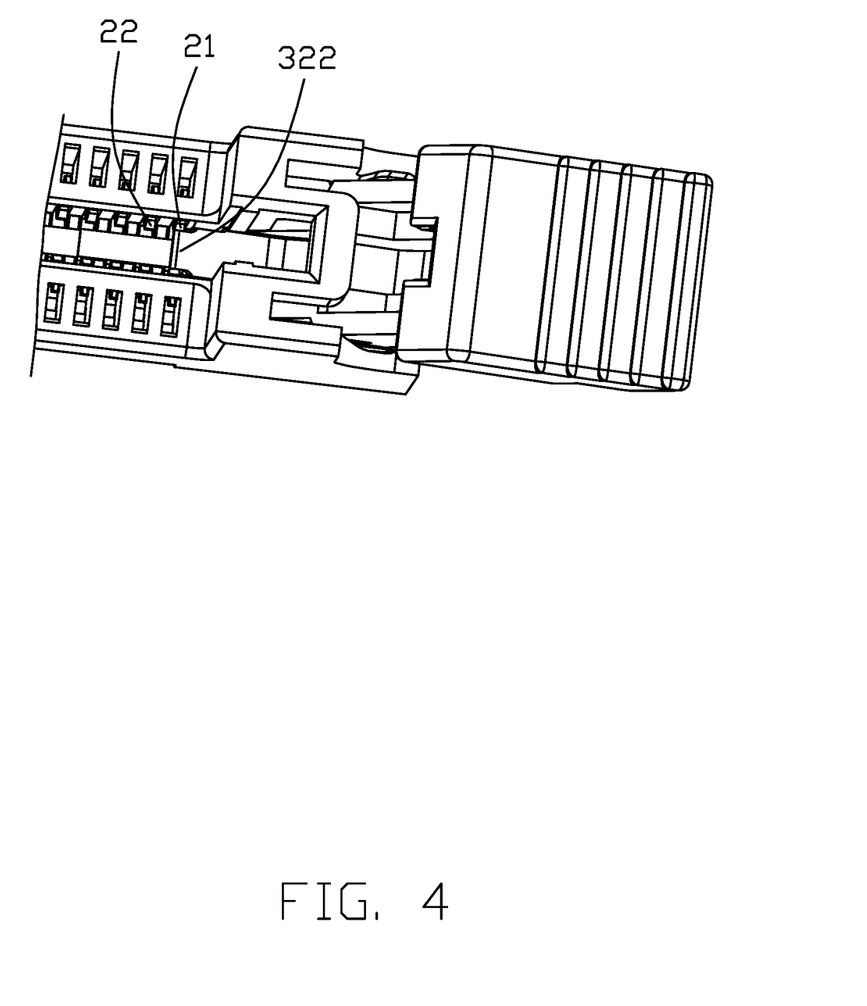
FIG. 4 is a downward perspective view of a portion of the card edge connector of FIG. 1.
Figure 5:
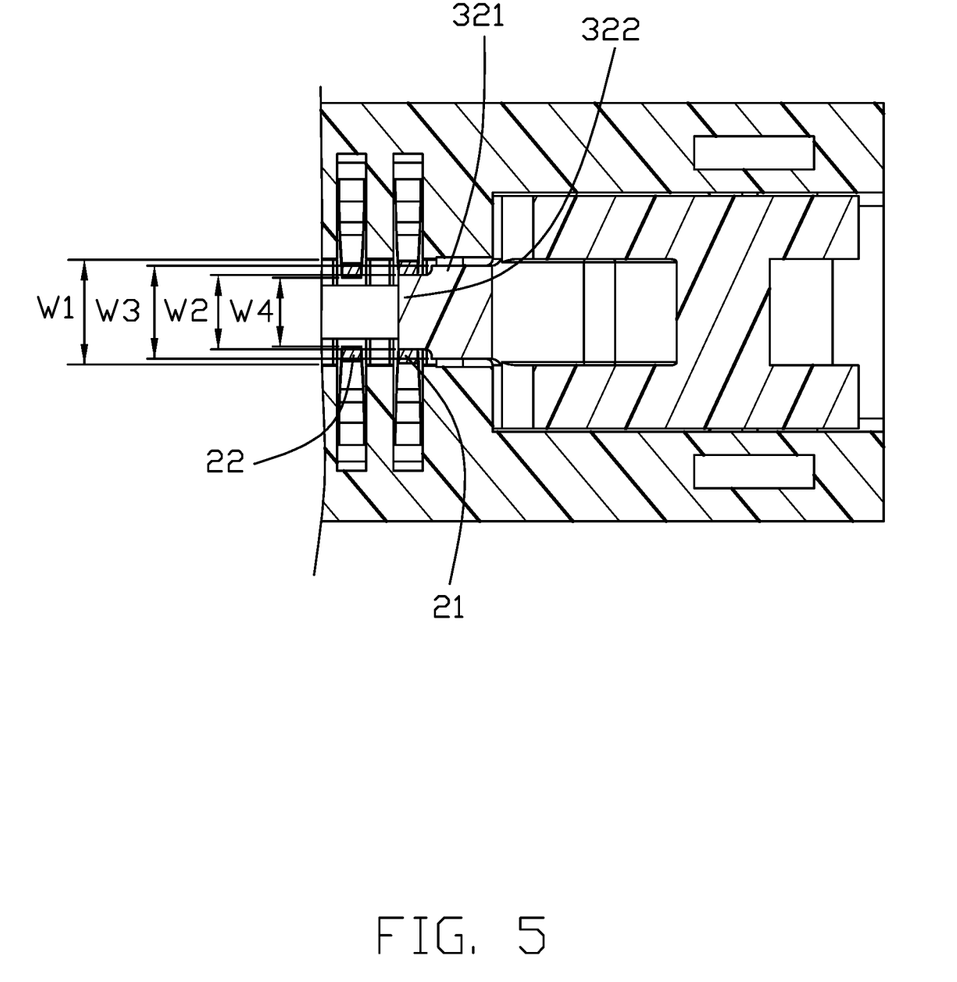
FIG. 5 is a top view of the portion of the card edge connector of FIG. 4.
Figure 6:
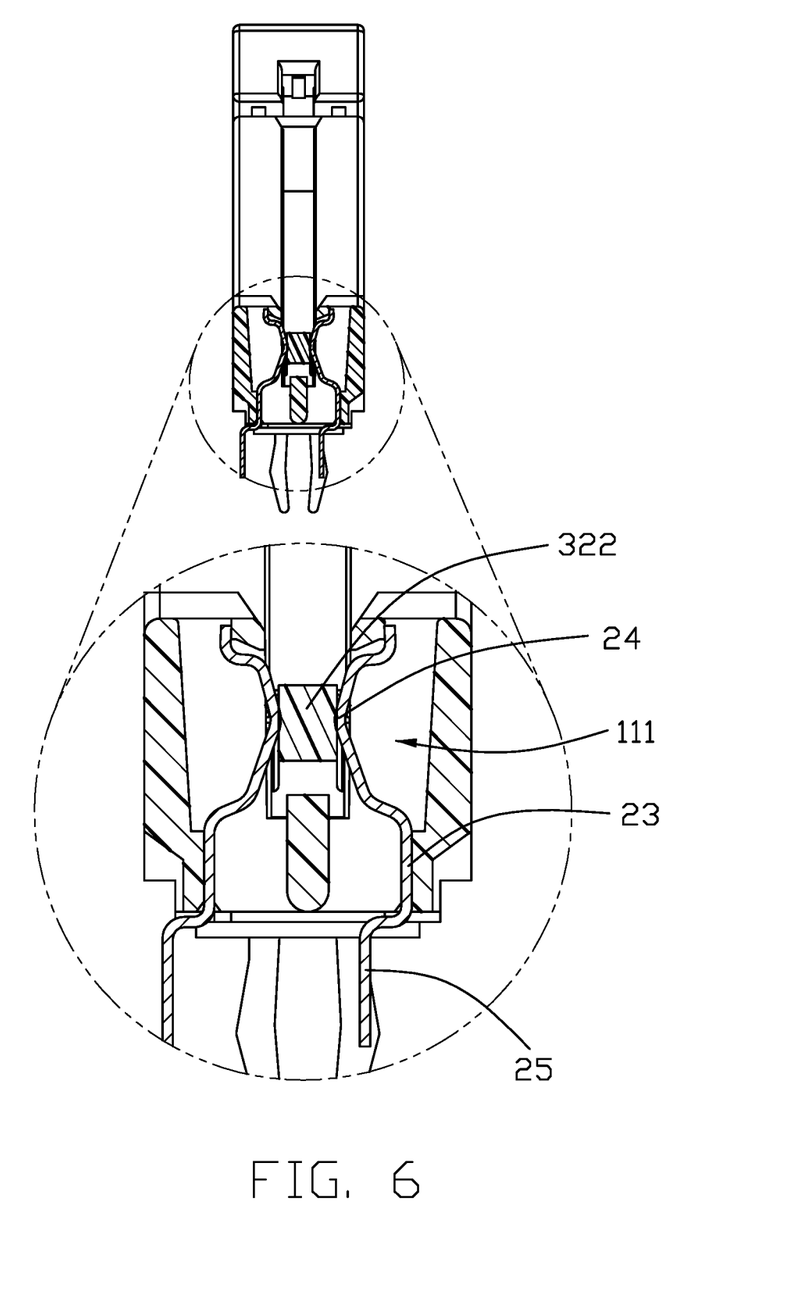
FIG. 6 is a cross-sectional view of the card edge connector of FIG. 1.
Figure 7:
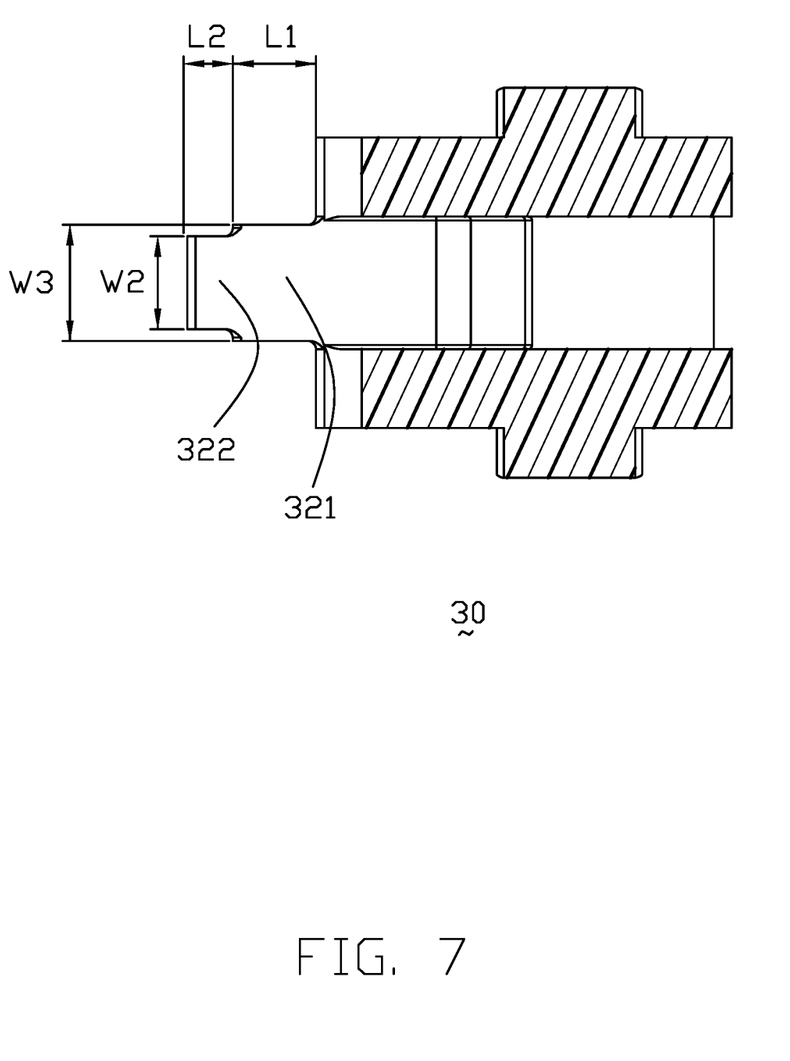
FIG. 7 is a cross-sectional view of the ejector of the electrical connector of FIG. 1.
Figure 8:
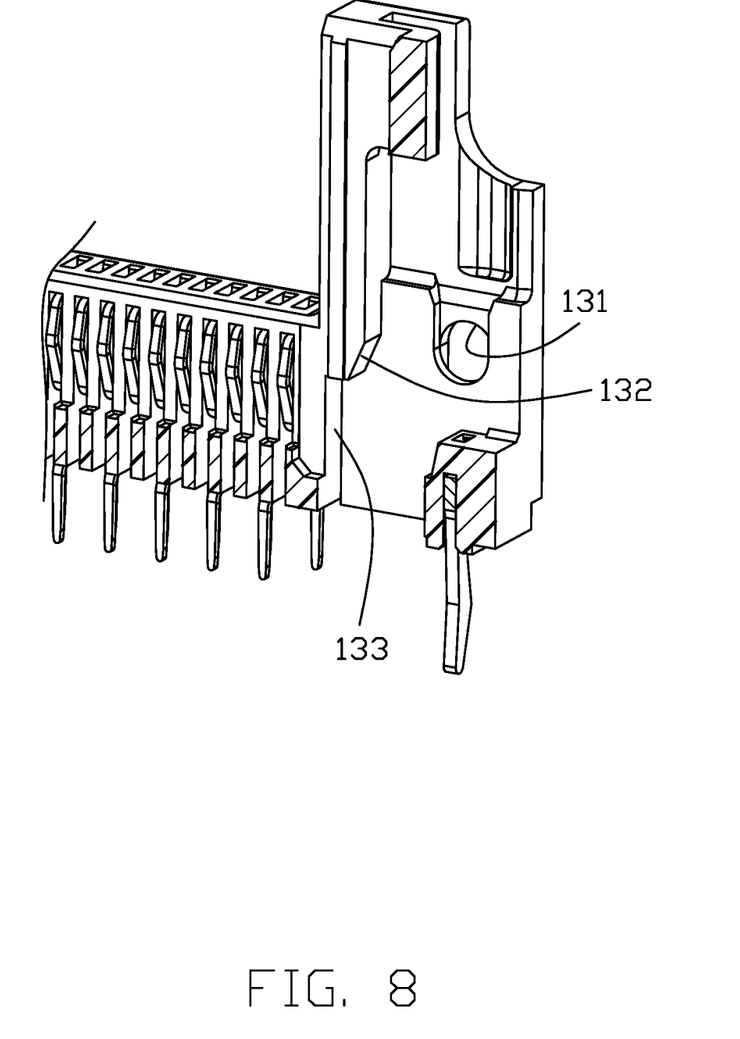
FIG. 8 is a perspective view of a portion of the electrical connector without showing the ejector of FIG. 1.
Figure 9:
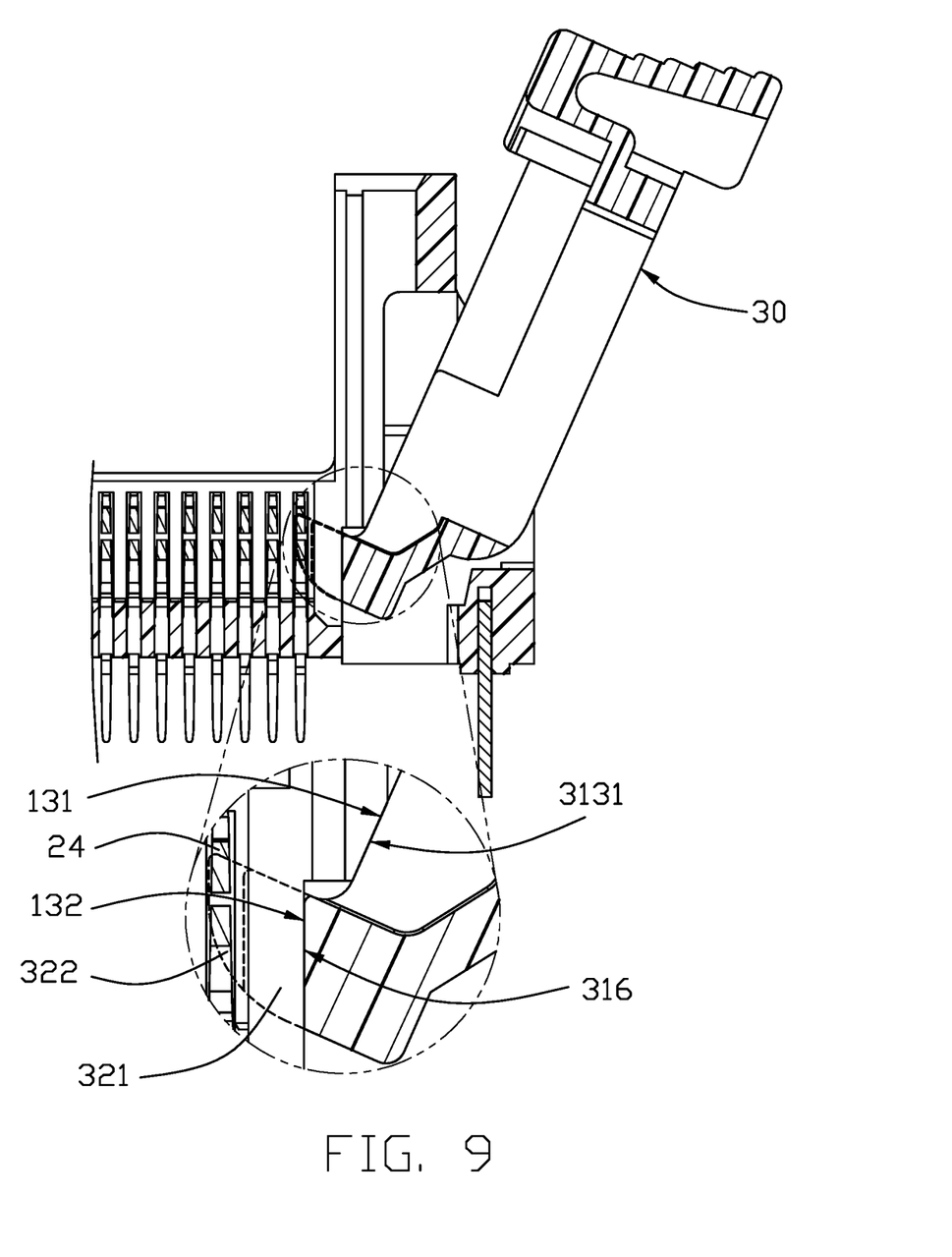
FIG. 9 is a cross-sectional view of a portion of the electrical connector of FIG. 1 to show the ejector is stopped by the housing in the outer position while the narrowed section of the locker of the ejector interferes with the contacting section of the outermost contacts.

Referring to FIGS. 1 to 9, a card edge connector 100 includes an elongated housing 10 having pair of side walls 11 with an elongated slot 12 extending along a longitudinal direction and located between the pair of side walls 11 in a transverse direction perpendicular to the longitudinal direction for receiving a memory module 200 (partially shown). Two rows of passageways 111 are formed in the pair of corresponding side walls 11, respectively. Two rows of contacts 20 are disposed in the corresponding passageways 111, respectively, so as to form a plurality of pairs in respective cross-sections in the transverse direction. Understandably, each pair of contacts 20 commonly sandwich the memory module therebetween in the transverse direction. A pair of towers 13 are located at two opposite ends of the housing 10. A pair of ejectors 30 are respectively retained in the corresponding towers 13 in a rotational manner. A pair of boardlocks 19 are secured to the bottom portions of the towers 13, respectively.

The contacts 20 include two pairs of first/outermost contacts 21 located at opposite two ends adjacent/neighboring to the corresponding towers 13, respectively, and plural pairs of second/inner contacts 22 located between those two pairs of first/outermost contacts 21. The contact 20 includes an upstanding section 23, a deflectable contacting section 24 upwardly extending from an upper end of the upstanding section 23 and into the slot 12, and a tail section 25 downwardly extending from a lower end of the upstanding section 23.

Each ejector 30 includes a main body 31, a kicker 32 located at the bottom portion of the main body 31 and inwardly extending toward the slot 12 for upwardly ejecting the memory module 200, and a locker 35 located at the top portion of the main body 31 for locking within a corresponding notch 202 of the memory module 200. An operation section 36 is formed beside the locker 35 for operation consideration. The main body 31 includes a first part 311 and a second part 313 below the first part 311 wherein the first part 311 is wider than the second part 313 in the transverse direction with a step 315 therebetween. A pair of protrusions 312 are formed on the first part 311 for engagement with the corresponding tower 13. A pair of pivots 314 are formed on the second part 313 to be received within the corresponding pivot holes 131 of the tower 13. The kicker 32 forms a front narrowed section 322 with a width W2, and a rear root section 321 with a width W3 larger than W2 in the transverse direction while both width W2 and width W3 are smaller than the width W1 of the slot 12 in the transverse direction. When the ejector 30 is rotated to be located in an opening/outer position, the front narrowed section 322 will slightly interfere with the contacting sections 24 of the corresponding pair of outermost/first contacts 21. A curved surface 323 is formed on a bottom surface of the front narrowed section 322. A pair of oblique stopping surfaces 316 are formed on the bottom portion of the second part 313 adjacent to the kicker 32 for abutting against corresponding vertical stopping faces 133 around the tower 13, and a pair of vertical stopping surfaces 3131 are formed on front edges of the second part 313 for abutting against corresponding oblique stopping faces 132 around the tower 13 so as to prevent excessive outward rotation of the ejector 30.

In this embodiment, both the paired first contacts 21 and the paired second contacts 22 are same with each other to have the same gap in each pair in the transverse direction. Notably, the gap/width W4 between the contacting sections 24 of the pair of first/outermost contacts 21 is slightly smaller than the width W2 of the front narrowed section 322 in the transverse direction so as to result in slight interference therebetween. Understandably, such a gap/width W4 is also smaller than a thickness W5 of the memory module 200 so as to make mechanical and electrical connected between the memory module 200 and the contacts 20. In this embodiment, the thickness W5 is not less than the width W2 of the front narrowed section 322 so as to assure the expected connection between the memory module and the pair of first/outermost contacts 21. To assure the required strength of the kicker 32 of the ejector 30, the dimension/length L1 of the rear root section 321, which is measured from the upper edge 3161 of the stopping surface 316 or the front edge 3161 of the second part 313 or of the main body 31, is larger than the dimension/length L2 of the front narrowed section 322 in the longitudinal direction. The length L1 is roughly two times of the length L1. The width W2 is roughly three fourths of the width W3.

Notably, when the ejector 30 is moved to be in an outer position for ejecting the memory module 200 out of the housing 10, the stopping surface 316 abuts against the corresponding vertical stopping face 133, the vertical stopping surface 3131 abuts against the corresponding stopping face 132, and the front narrowed section 322 is slightly intimately sandwiched between the pair of first contacts 21 in an interference fit and so as to have the ejector 30 is in a stationary state. Understandably, the protrusion 312 also holds the ejector 30 in position with regard to the tower 13.

It is to be understood, however, that even though numerous, characteristics and advantages of the present invention have been set forth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for use with a card type memory module, comprising:
   an insulative elongated housing extending along a longitudinal direction and having a pair of side walls with an elongated slot therebetween in a transverse direction perpendicular to the longitudinal direction;
   a pair of towers formed at two opposite ends of the housing, each tower forming at least a stopping face;
   a pair of ejectors respectively retained in the corresponding towers in a rotational manner, each of said ejectors including a main body, a horizontally extending kicker at a bottom portion of the main body for ejecting the memory module out of the housing, and a locker at a top portion of the main body for locking the memory module in the housing, each ejector forming a stopping surface;
   two rows of passageways formed in the corresponding side walls, respectively; and
   two rows of contacts disposed in the corresponding passageways, respectively, each of said contacts includes a resilient contacting section extending into the slot and a tail section exposed outside of the housing, the contacts being paired in the transverse direction so as to have a gap formed between the corresponding contacting sections of each paired contacts in the transverse direction; wherein
   when each ejector is outwardly rotated to an outer position, the stopping surface of the ejector abuts against the stopping face of the tower, and a front section of the kicker having a width larger than the gap in the transverse direction, enters the gap of the contacting sections of corresponding outermost paired contacts and is slightly sandwiched between the contacting sections of the corresponding outermost paired contacts in an interference fit so as to slightly retain the ejector in position with regard to the corresponding tower.

2. The electrical connector as claimed in claim 1, wherein a width of the front section of the kicker is not larger, in the transverse direction, than a thickness of the memory module for not jeopardizing the contacting sections of the corresponding outermost paired contacts.

3. The electrical connector as claimed 1, wherein the kicker of each ejector further includes a rear root section wider than the front section in the transverse direction.

4. The electrical connector as claimed in claim 3, wherein both the front section and the rear root section are located in front of the corresponding stopping surface in the longitudinal direction.

5. The electrical connector as claimed in claim 4, wherein the width of the front section is around three fourths of a width of the rear root section in the transverse direction.

6. The electrical connector as claimed in claim 4, wherein measured from a front edge of the main body of the ejector, along the longitudinal direction a length of the rear root section is around two times of a length of the front section.

7. The electrical connector as claimed in claim 1, wherein when the ejector is located in an upstanding locking position, the stopping surface is either oblique or vertical.

8. The electrical connector as claimed in claim 7, wherein if the stopping surface is oblique, the corresponding stopping face is vertical while if the stopping surface is vertical, the corresponding stopping face is oblique.

9. An electrical connector for use with a card type memory module, comprising:
- an insulative elongated housing extending along a longitudinal direction and having a pair of side walls with an elongated slot therebetween in a transverse direction perpendicular to the longitudinal direction, the side walls defining passageways thereon, respectively;
- a pair of towers formed at two opposite ends of the housing;
- a pair of ejectors respectively retained in the corresponding towers in a rotational manner, each of said ejectors including a main body, a kicker at a bottom portion of the main body for ejecting the memory module out of the housing, and a locker at a top portion of the main body for locking the memory module in the housing;
- contacts disposed in the corresponding passageways, respectively, each of said contacts includes a resilient contacting section extending into the slot and a tail section exposed outside of the housing, outermost contacts being paired in the transverse direction at each opposite end of the housing so as to have a gap between the corresponding contacting sections of the paired contacts in the transverse direction; wherein
- when during an outer rotation of the ejector, a front section of the kicker, enters the gap and cross the contacting sections of corresponding outermost paired contacts and scrape the contacting sections of the corresponding outermost paired contacts.

10. The electrical connector as claimed in claim 9, wherein the ejector has an oblique stopping surface and the corresponding tower has a vertical stopping face abutting against the oblique stopping surface when the ejector is rotated to be located in the outer position.

11. The electrical connector as claimed in claim 9, wherein the ejector has an upstanding vertical stopping surface and the corresponding tower has an oblique stopping face abutting against the vertical stopping surface when the ejector is rotated to be located in the outer position.

12. The electrical connector as claimed 9, wherein a width of the front section of the kicker is not larger, in the transverse direction, than a thickness of the memory module for not jeopardizing the contacting sections of the corresponding outermost paired contacts.

13. The electrical connector as claimed in claim 12, wherein the kicker of each ejector further includes a rear root section wider than the front section in the transverse direction, both the front section and the rear root section are located in front of a front edge of the main body of the ejector in the longitudinal direction.

14. The electrical connector as claimed in claim 13, wherein the width of the front section is around three fourths of a width of the rear root section in the transverse direction.

15. The electrical connector as claimed in claim 13, wherein measured from the front edge of the main body of the ejector, along the longitudinal direction a length of the rear root section is around two times of a length of the front section.

16. An electrical connector for use with a card type memory module, comprising:
- an insulative elongated housing extending along a longitudinal direction and having a pair of side walls with an elongated slot therebetween in a transverse direction perpendicular to the longitudinal direction;
- a pair of towers formed at two opposite ends of the housing;
- a pair of ejectors respectively retained in the corresponding towers in a rotational manner, each of said ejectors including a main body, a horizontally extending kicker at a bottom portion of the main body for ejecting the memory module out of the housing, and a locker at a top portion of the main body for locking the memory module in the housing;
- two rows of passageways formed in the corresponding side walls, respectively; and
- two rows of contacts disposed in the corresponding passageways, respectively, each of said contacts includes a resilient contacting section extending into the slot and a tail section exposed outside of the housing, the contacts being paired in the transverse direction so as to have a gap formed between the corresponding contacting sections of each paired contacts in the transverse direction; wherein
- when each ejector is outwardly rotated to move to an outer position, a front section of the kicker having a width larger than the gap in the transverse direction, enters the gap of the contacting sections of corresponding outermost paired contacts and is slightly sandwiched between the contacting sections of the corresponding outermost paired contacts in an interference fit so as to slightly retain the ejector in position with regard to the corresponding tower; wherein
- the kicker of each ejector further includes a rear root section wider than the front section in the transverse direction;
- wherein both the front section and the rear root section are located in front of a front edge of the main body of the ejector in the longitudinal direction.

17. The electrical connector as claimed in claim 16, wherein the width of the front section is around three fourths of a width of the rear root section in the transverse direction.

18. The electrical connector as claimed in claim 16, wherein measured from the front edge of the main body of the ejector, along the longitudinal direction a length of the rear root section is around two times of a length of the front section.

* * * * *